United States Patent [19]
Bitller et al.

[11] Patent Number: 4,858,068
[45] Date of Patent: Aug. 15, 1989

[54] ELECTRONIC CIRCUIT HOUSING

[75] Inventors: Jean-Pierre Bitller, Plaisir; Pascal Faucher, Longjumeau; Monique Hang-Hu, Sainte Genevieve des Bois; André Pelet, Maurepas, all of France

[73] Assignee: Alcatel CIT, Paris, France

[21] Appl. No.: 251,161

[22] Filed: Mar. 23, 1988

[51] Int. Cl.⁴ ............................................. H05K 7/20
[52] U.S. Cl. .................................. 361/380; 361/388; 361/396; 165/179; 174/70 S; 138/108; 455/601
[58] Field of Search .............. 350/96.2, 319; 455/601; 379/338; 138/108; 357/81; 174/16.3, 47, 52.1, 70 S; 165/177, 179, 181, 183, 80.2, 185, 104.33; 361/331, 380, 382, 386, 387, 388, 389, 393, 394, 396, 417, 419, 420

[56] References Cited
U.S. PATENT DOCUMENTS

| | | | |
|---|---|---|---|
| 4,400,858 | 8/1983 | Goiffen | 361/386 |
| 4,528,615 | 7/1985 | Perry | 361/386 |
| 4,603,344 | 7/1986 | Trommer | 361/396 |
| 4,679,250 | 7/1987 | Davis | 174/70 S |
| 4,730,234 | 3/1988 | Monico Jr. | 361/394 |

FOREIGN PATENT DOCUMENTS

| | | |
|---|---|---|
| 193242 | 8/1906 | Denmark . |
| 2473132 | 10/1981 | France . |
| 1571679 | 7/1980 | United Kingdom . |
| 2139859 | 11/1984 | United Kingdom . |
| 2152297 | 7/1985 | United Kingdom . |

*Primary Examiner*—Gerald P. Tolin
*Attorney, Agent, or Firm*—Sughrue, Mion, Zinn, Macpeak & Seas

[57] ABSTRACT

An electronic circuit housing primarily applicable to undersea transmission-line repeater equipment includes a pressure-resistant tubular steel shell provided with water-tight end walls and containing a cylindrical assembly of frames having the shape of cylindrical sectors. Each frame is attached at one end to a radial flange of the internal shell wall and at the other end to an expandable collar provided with sliding wedges and locked by expansion in the internal shell wall. The fastening system facilitates mounting and accurate centering of the frames within the tubular shell, thereby guaranteeing a constant thickness and therefore uniform thermal conductivity of the interface between frame and tubular shell.

9 Claims, 5 Drawing Sheets

ELECTRONIC CIRCUIT HOUSING

BACKGROUND OF THE INVENTION

1. Field of the Invention

The present invention relates to a tubular electronic circuit housing of the type employed for submarine telephone transmission-link repeaters.

This type of housing is intended to reconcile different requirements which include high mechanical strength for withstanding cable laying and recovery operations while at the same time affording resistance to the sea-bottom pressure, high electrical insulation of circuits which may be at a very different electric potential with respect to the sea ground potential by reason of their mode of remote power supply from the ends of the cable link, and efficient removal of heat from the electronic circuits t the external medium.

In the case of present-day transmission systems which operate at very high speed, the electronic circuits dissipate a larger amount of heat. Should it be found desirable to guard against any danger of a considerable increase in operating temperature since this adversely affects the reliability of these circuits in the long term, it is accordingly necessary to increase the heat-dissipating capacity of the circuit housing.

2. Description of the Prior Art

With a view to solving the problem outlined in the foregoing, a number of different design solutions have already been provided in the prior art.

One known solution described in French Pat. No. FR-A-2 558 664 consists of a repeater housing in which the electronic circuits are arranged in the form of function-specialized or dedicated modules enclosed in cases having the shape of thick disks and stacked within a tubular shell of pressure-resistant steel. Each module has a central partition for supporting electronic circuits, said partition being surrounded by an annular casing equipped on four sides with resilient shoes which are applied on the internal wall of the tubular shell and have the double function of providing electrical insulation and transmitting heat to the shell. Apart from the complexity of construction of the shoes, this structure has the disadvantage of imposing a flow path of substantial length including throttled portions through which the heat flow has to pass before it can be removed through the outer shell.

In another known repeater housing disclosed in U.S. Pat. No. 4,528,615, the electronic circuits are disposed in modules mounted within frames in the form of cylindrical sectors or so-called segments assembled in a group of three each extending through an angle of 120° and forming a single cylindrical unit, this unit being placed within a tubular jacket which is designed to withstand pressure and to provide electrical insulation. The internal diameter of the tubular jacket is slightly larger than that of the cylinder formed by the assembled frames in order to make allowance for deformations which are liable to occur as a result of the external pressure. The frames are applied against the internal wall of the jacket by means of intercalary springs which tend to move said frames away from each other. The disadvantage of this structure lies in the fact that, in order to remove heat by conduction through the tubular jacket, it is necessary to establish an intimate contact between accurately curved surfaces which must ensure a perfect fit. However, one of these surfaces is liable to undergo deformation under the action of the external pressure and the mounting system which involves the use of intercalary springs may not be capable of uniform gap-width distribution and would thus be liable to produce misalignments.

SUMMARY OF THE INVENTION

The present invention is directed to an electronic circuit housing of the above-mentioned type having a cooling capacity which is practically not influenced by deformations of the tubular shell, which remains of simple design and which can readily be assembled.

The invention accordingly has for its object a housing for electronic circuits including a tubular shell in which are assembled frames each having the shape of a cylindrical sector for supporting the electronic circuits. Said housing is provided with means for fastening the frames to the shell, said means being constituted at one end of said shell by a flange which is integral with the internal wall of the shell and to which the frames are attached at one end and, at the other end of the shell, by an expandable collar which is screwed to the frames at the end opposite to the flange and is locked in position by expansion within the shell, as well as a flexible intercalary sleeve having low thermal resistance and placed between the frames and the internal wall of the shell.

Fastening of the frames in the form of cylindrical sectors within the tubular shell at one end on the internal flange and at the other end on the expandable collar which is wedged against the internal wall of the shell permits alignment of the frames with respect to the internal wall of the shell with a high degree of accuracy and consequently ensures highly uniform thickness of the annular space reserved for the flexible intercalary sleeve. By reason of its flexibility, said sleeve adapts itself to the shell deformations produced by the immersion pressure without modifying its contact surfaces.

The expandable collar is advantageously formed by a ring slidably mounted with play within the shell and screwed to the frames and by an assembly of wedges interposed between the ring and the shell and thrust by the frames towards the upper end of ramps carried by the periphery of said ring.

The flexible intercalary sleeve having low thermal resistance is advantageously a woven-wire fabric element, the meshes of which ensure numerous points of contact.

BRIEF DESCRIPTION OF THE DRAWINGS

FIG. 8 is a detail view showing the portion A of FIG. 2.

DETAILED DESCRIPTION OF THE INVENTION

Figure 1:
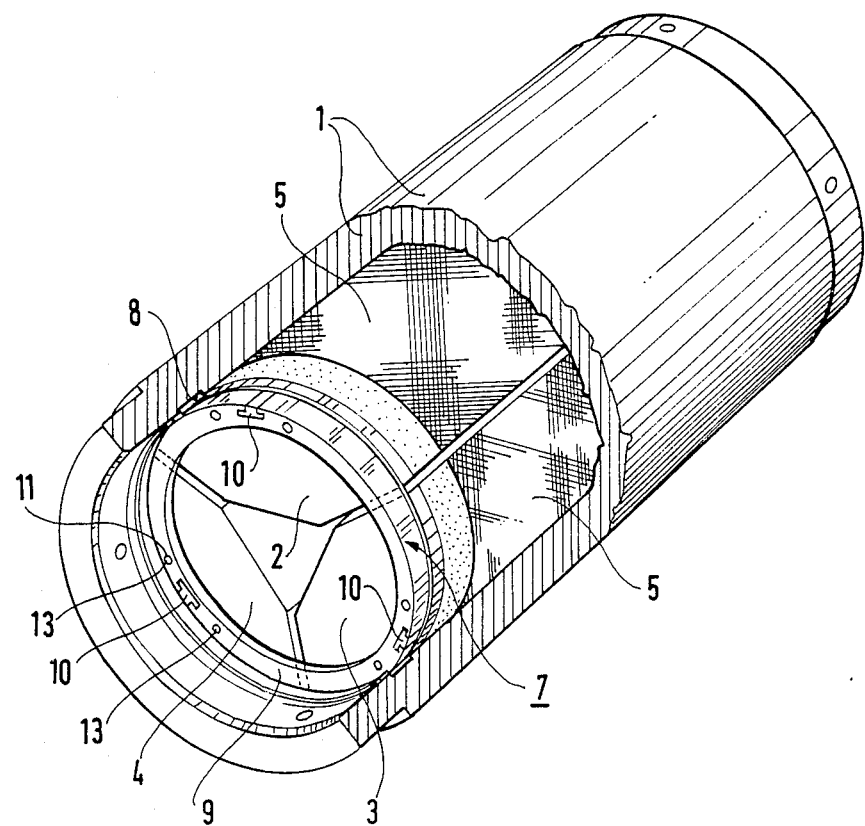
FIG. 1 is a schematic view in perspective with a portion broken away and shows an electronic circuit housing in accordance with the invention for an undersea repeater.
Figure 2:
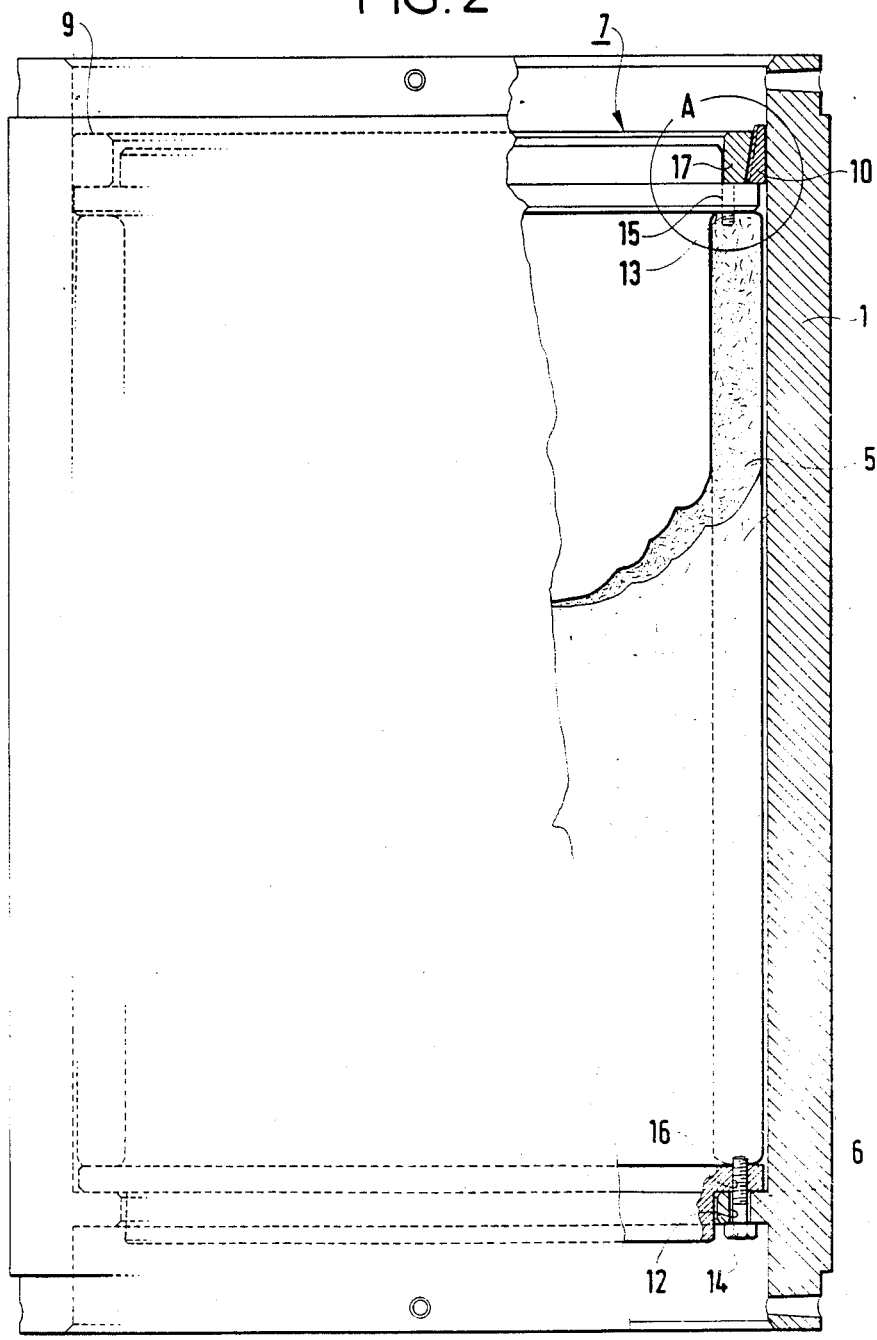
FIG. 2 is a view in elevation with a portion broken away and shows the housing of FIG. 1.
Figure 3:
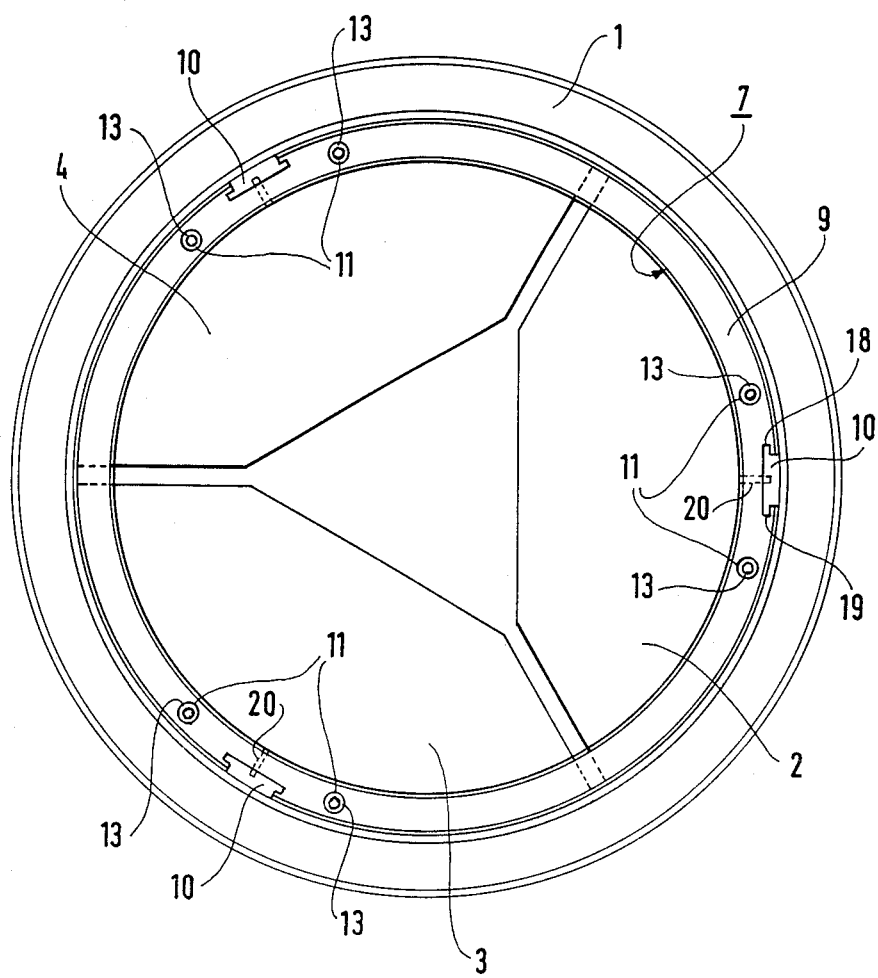
FIG. 3 is an end view of the repeater housing shown in the previous figures.

The electronic circuit housing shown in FIGS. 1 to 3 constitutes an enclosure for the electronic and electro-optical equipment of an undersea transmission-line repeater. In order to meet pressure-resistant design requirements, the housing is closed at each end by pressure and water tight walls (not shown in the drawings) each provided with a cable lead-in bushing. The housing is covered with a layer of polyethylene for providing insulation from sea potential and is placed in the central portion of the repeater within a casing which terminates at each end in cable connection chambers and is designed to withstand the mechanical stresses exerted on the repeater during laying and recovery operations.

The aforesaid housing must afford high mechanical resistance to pressure. Cooled by seawater through the repeater casing, the circuit housing must in turn have high thermal conductivity in order to permit maximum heat removal as well as operation of equipment at a temperature which is as low as possible. The housing consists of a tubular shell 1 of pressure-resistant steel containing a cylindrical unit resulting from the assembly of three equipment frames 2, 3, 4 in the form of cylindrical sectors.

The frames 2, 3, 4 aforesaid consist of solid metal parts having very good thermal conductivity and serve as radiators for the equipment which they contain. Said frames are covered o their external cylindrical face with a resilient woven-wire fabric element 5 which is intended to fill the space between said frames and the internal wall of the tubular shell 1, to endow said space with good thermal conductivity and to absorb elastic deformations of the tubular shell 1 produced by the sea-bottom environment. The bases of said frames in the form of circular sectors are attached individually to the metallic shell and bolted at one end to an internal radial flange 6 of the tubular shell 1 and at the other end to an expandable collar 7 which is fitted in the tubular shell 1 and wedged against the internal wall of this latter opposite to a shallow channel 8.

Figure 4:
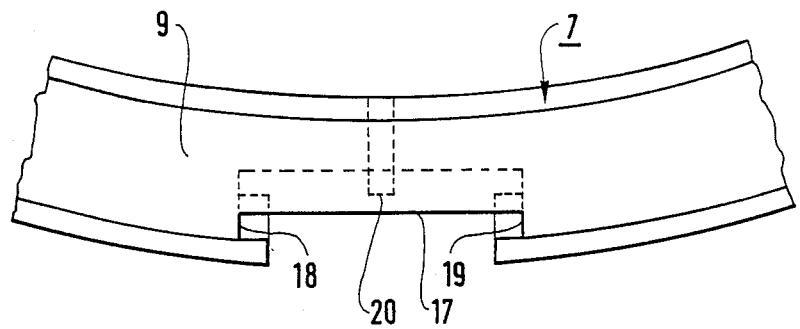
FIG. 4 is a fragmentary view showing a detail of an expandable fastening collar employed in the repeater housing.

The expandable collar 7 is formed by a rigid metal ring 9 having a rectangular cross-section and equipped at its periphery with a system of clamping wedges 10. The metal ring 9 and the internal radial flange 6 are pierced with a peripheral series of axial holes 11, 12 respectively for the insertion of fixing screws 13, 14 respectively screwed into internally-threaded bores 15, 16 respectively which are formed in opposite relation in the bases of the frames. The external diameter of the metal ring 9 is slightly smaller than the internal diameter of the tubular shell 1. Said ring is capable of effortless displacement within said shell and is provided on its external periphery with uniformly spaced slide ramps 17 as illustrated in greater detail in FIGS. 4, 7 and 8. Said slide ramps are cut in the external periphery of the metal ring 9 opposite to the internal wall of the tubular shell 1 in the direction respectively of generator-lines of a right circular cone, the vertex of which is located outside the metal ring 9 on its axis, on the side which comes into contact with the frames 2, 3, 4, and the generator-lines of which are inclined to said axis at an angle $\alpha$ of approximately 10°. Said slide ramps have a T-shaped cross-section with two lateral grooves 18, 19. A retaining pin 20 projects at the bottom of each slope or in other words at the end which is directed towards the vertex of the cone and is adapted to cooperate with the lateral grooves 18, 19 for the purpose of retaining the clamping wedges 10 against the ring 9 when they are in the withdrawn position.

Figure 5:
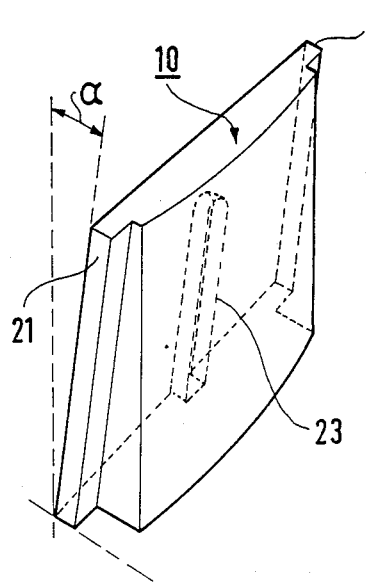
FIGS. 5 and 6 are views in perspective showing clamping wedges fitted in the expandable fastening collar.
Figure 6:
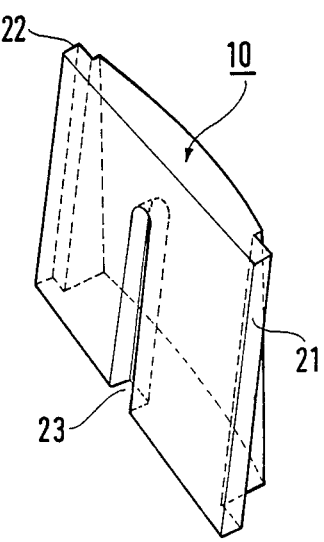

The clamping wedges 10 which are more particularly shown in FIGS. 5 and 6 are of slightly greater length than the thickness of the ring 9. They have the same angle of slope as the slide ramps 17 and a cambered external profile having the same curvature as the internal wall of the tubular shell 1 opposite to the channel 8. The flat sole of each wedge has the same width as the slide ramps 17 and is provided with two lateral flanges 21, 22 having the same dimensions as the lateral grooves 18, 19 in which they are slidably fitted. A central longitudinal groove 23 cut in said sole does not have an opening at the end corresponding to the thin end of the wedge and frees the space required for displacement of the retaining pin 20.

Each clamping wedge 10 is introduced on a slide ramp 17 of the metal ring 9 at the top of the slide ramp and on the side opposite to its thin end.

Figure 7:
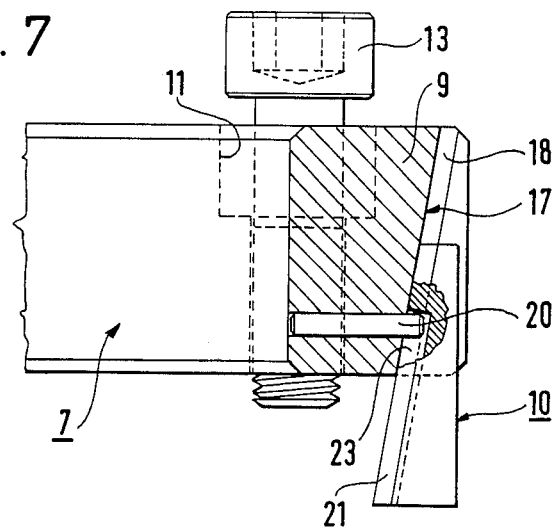
FIGS 7 and 8 are views illustrating the movement of the clamping wedges during assembly of the fastening collar within the housing; in addition.
Figure 8:
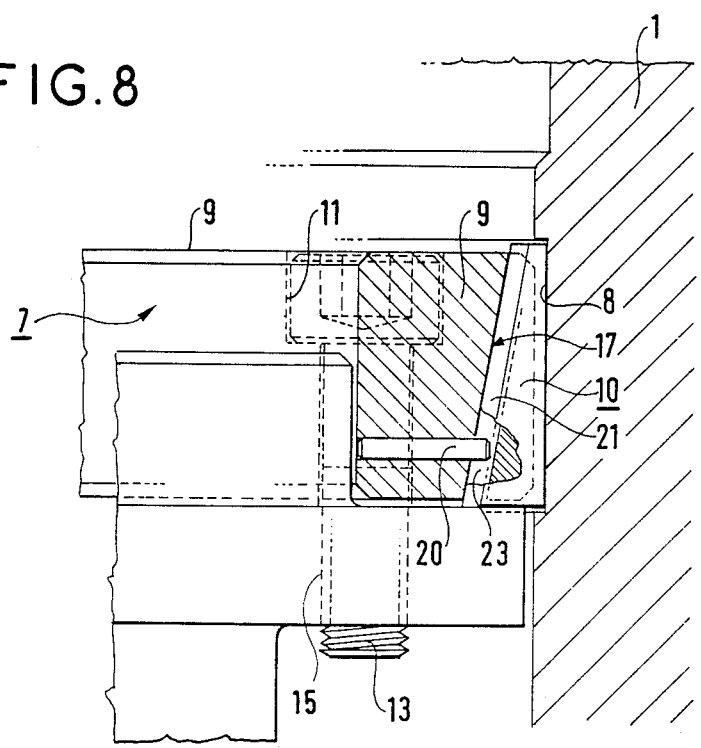

FIG. 7 shows a clamping wedge 10 placed at the lower end of its ramp 17 on the metal ring 9 in the withdrawn position and abuttingly applied against the retaining pin 20. The wedge projects substantially beyond the metal ring 9 on the side which is intended to come into contact with the frames 2, 3, 4. FIG. 8 which is a detail view of the circled portion A of FIG. 2 shows the same clamping wedge 10 in the locking position whereas the metal ring 9 has been screwed to the frames 2, 3 and 4 and has been forcibly displaced on its ramp 17 in the upward direction by reason of the fact that the metal ring 9 has been moved towards the frames 2, 3, 4.

This system of attachment makes it particularly easy to mount the frames 2, 3, 4 within the tubular shell since it does not call for any pre-assembly of the frames 2, 3, 4 with respect to each other in order to form a cylindrical unit which is to be forcibly introduced into the tubular shell 1. In fact, in order to produce this result, the frames 2, 3, 4 are presented one after the other within the tubular shell 1, which does not give rise to any difficulty since these frames have sufficient space to engage without effort. They are screwed to the radial flange, whereupon the expansion collar 7 is introduced against the frames together with its clamping wedges 10 in the withdrawn position and maintained against the metal ring 9 by the pins 20. The metal ring 9 is then screwed to the frames 2, 3, 4, thus bringing it closer to the frames 2, 3 and 4 and resulting on the one hand in re-centering of the frames 2, 3, 4 with respect to the internal wall of tee tubular shell 1 and on the other hand in upward displacement of the clamping wedges 10 along their ramps in the direction of the channel 8 which is formed in the internal wall of the tubular shell and in which they are locked in position.

This fastening system ensures highly accurate centering of the frames 2, 3, 4 with respect to the internal wall of the tubular shell 1, thus guaranteeing uniformity of thermal conductivity of the woven-wire fabric element at all points of the intercalary space between the frames and the internal wall of the shell and ensuring good reproducibility of the characteristics of heat dissipation from one repeater to the other.

Without departing from the scope of the invention, it is possible to modify certain arrangements or to replace certain means by equivalent means. It is possible in particular to modify the number of clamping wedges with which the expansion collar is equipped and to replace the woven-wire element by another flexible material which has predetermined compressive strength under a known pressure and good thermal conductivity. The dimensions of the frames and especially the angle of circular sector occupied by each frame may vary. In the example described, each frame occupies a circular sector of 120°. However, consideration could be given to frames which occupy either a larger circular sector such as 180°, for example (in which case two frames would be sufficient to form a cylinder) or a smaller circular sector. In addition, it is not necessary to employ a number of frames for re-forming a cylinder since the remaining space may be occupied by a spacer member of suitable shape.

What is claimed is:

1. A housing for electronic circuits including a tubular shell in which are assembled frames each having the shape of a cylindrical sector containing the electronic circuits, wherein said housing is provided with means for fastening the frames within the tubular shell, said means being constituted at one end of said tubular shell by an internal radial flange which is integral with the internal wall of the tubular shell and to which the frames are attached at one end, and at the other end of the tubular shell by an expandable collar which is attached to said frames in such a manner as to produce expansion and locking within said tubular shell.

2. A housing according to claim 1, wherein said expandable collar has a rigid ring having a rectangular cross-section and displaceable in effortless sliding motion within the tubular shell and a system of clamping wedges which are mounted at the periphery of the ring opposite to the internal wall of the tubular shell and which project towards the frames in the withdrawn position thereof.

3. A housing according to claim 2, wherein said ring is provided with slide ramps for clamping wedges, said ramps being cut in the external periphery of said ring opposite to the internal wall of the tubular shell in the direction respectively of generator-lines of a right circular cone whose vertex is located outside the ring on the axis of said ring and on the side directed towards the frames.

4. A housing according to claim 3, wherein said slide ramps have a T-shaped cross-section with two lateral grooves.

5. A housing according to claim 3, wherein the lower end of each slide ramp is locked by a retaining pin.

6. A housing according to claim 2, wherein said clamping wedges have a length which is greater than the thickness of the ring.

7. A housing according to claim 4, wherein said clamping wedges each have a flat sole of the same width as the slide ramps, said sole being provided with two lateral flanges having dimensions corresponding to the lateral grooves in which said flanges are slidably fitted.

8. A housing according to claim 5, wherein said clamping wedges each have a flat sole with a central longitudinal groove which is cut in the lower portion of the wedge but which does not have an opening at the thin end of said wedge and serves to free the space required for displacement of the retaining pin.

9. A housing according to claim 2, wherein said clamping wedges are each provided with a cambered external profile having the same curvature as the internal wall of the tubular shell opposite to a channel in which said wedges are locked in position.

* * * * *